(12) United States Patent
Lu et al.

(10) Patent No.: US 10,812,083 B2
(45) Date of Patent: Oct. 20, 2020

(54) TECHNIQUES FOR COMPUTING DOT PRODUCTS WITH MEMORY DEVICES

(71) Applicant: The Regents of The University of Michigan, Ann Arbor, MI (US)

(72) Inventors: Wei Lu, Ann Arbor, MI (US); Fuxi Cai, Ann Arbor, MI (US); Patrick Sheridan, Ann Arbor, MI (US); Chao Du, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 16/669,324

(22) Filed: Oct. 30, 2019

(65) Prior Publication Data
US 2020/0067512 A1 Feb. 27, 2020

Related U.S. Application Data

(63) Continuation of application No. 16/235,115, filed on Dec. 28, 2018, now Pat. No. 10,498,341, which is a
(Continued)

(51) Int. Cl.
*H03K 19/17748* (2020.01)
*G11C 13/00* (2006.01)
(Continued)

(52) U.S. Cl.
CPC ... *H03K 19/17748* (2013.01); *G06F 9/30036* (2013.01); *G06F 17/16* (2013.01);
(Continued)

(58) Field of Classification Search
CPC ......... H03K 19/17748; G11C 13/0069; G11C 13/0007; G11C 2213/77; H04L 49/101;
(Continued)

(56) References Cited

U.S. PATENT DOCUMENTS 9,691,479 B1* 6/2017 Merced Grafals ...................... G11C 13/0069
2016/0336064 A1* 11/2016 Seo .......................... G06N 3/088
(Continued)

*Primary Examiner* — Daniel D Chang

(57) ABSTRACT

Sparse representation of information performs powerful feature extraction on high-dimensional data and is of interest for applications in signal processing, machine vision, object recognition, and neurobiology. Sparse coding is a mechanism by which biological neural systems can efficiently process complex sensory data while consuming very little power. Sparse coding algorithms in a bio-inspired approach can be implemented in a crossbar array of memristors (resistive memory devices). This network enables efficient implementation of pattern matching and lateral neuron inhibition, allowing input data to be sparsely encoded using neuron activities and stored dictionary elements. The reconstructed input can be obtained by performing a backward pass through the same crossbar matrix using the neuron activity vector as input. Different dictionary sets can be trained and stored in the same system, depending on the nature of the input signals. Using the sparse coding algorithm, natural image processing is performed based on a learned dictionary.

24 Claims, 10 Drawing Sheets

Related U.S. Application Data continuation of application No. 15/960,772, filed on Apr. 24, 2018, now Pat. No. 10,171,084.

(60) Provisional application No. 62/489,144, filed on Apr. 24, 2017.

(51) Int. Cl.
| | |
|---|---|
| *H04Q 3/00* | (2006.01) |
| *H04Q 11/00* | (2006.01) |
| *G06F 9/30* | (2018.01) |
| *G06N 3/063* | (2006.01) |
| *G06N 3/02* | (2006.01) |
| *G06F 17/16* | (2006.01) |
| *H04L 12/933* | (2013.01) |

(52) U.S. Cl.
CPC ............... *G06N 3/02* (2013.01); *G06N 3/063* (2013.01); *G11C 13/0007* (2013.01); *G11C 13/0069* (2013.01); *H04L 49/101* (2013.01); *H04Q 3/0004* (2013.01); *H04Q 11/00* (2013.01); *G11C 2213/77* (2013.01)

(58) Field of Classification Search
CPC .. H04Q 3/0004; H04Q 11/00; G06F 9/30036; G06F 17/16; G06N 3/063; G06N 3/02
See application file for complete search history.

(56) References Cited

U.S. PATENT DOCUMENTS

| | | | |
|---|---|---|---|
| 2018/0095930 A1* | 4/2018 | Lu | ....................... G11C 13/0002 |
| 2018/0309451 A1* | 10/2018 | Lu | ..................... H03K 19/17748 |
| 2019/0019564 A1* | 1/2019 | Li | ....................... G11C 11/1653 |

\* cited by examiner

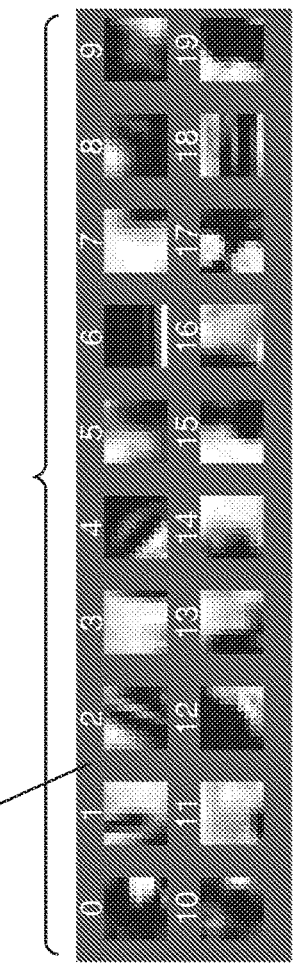
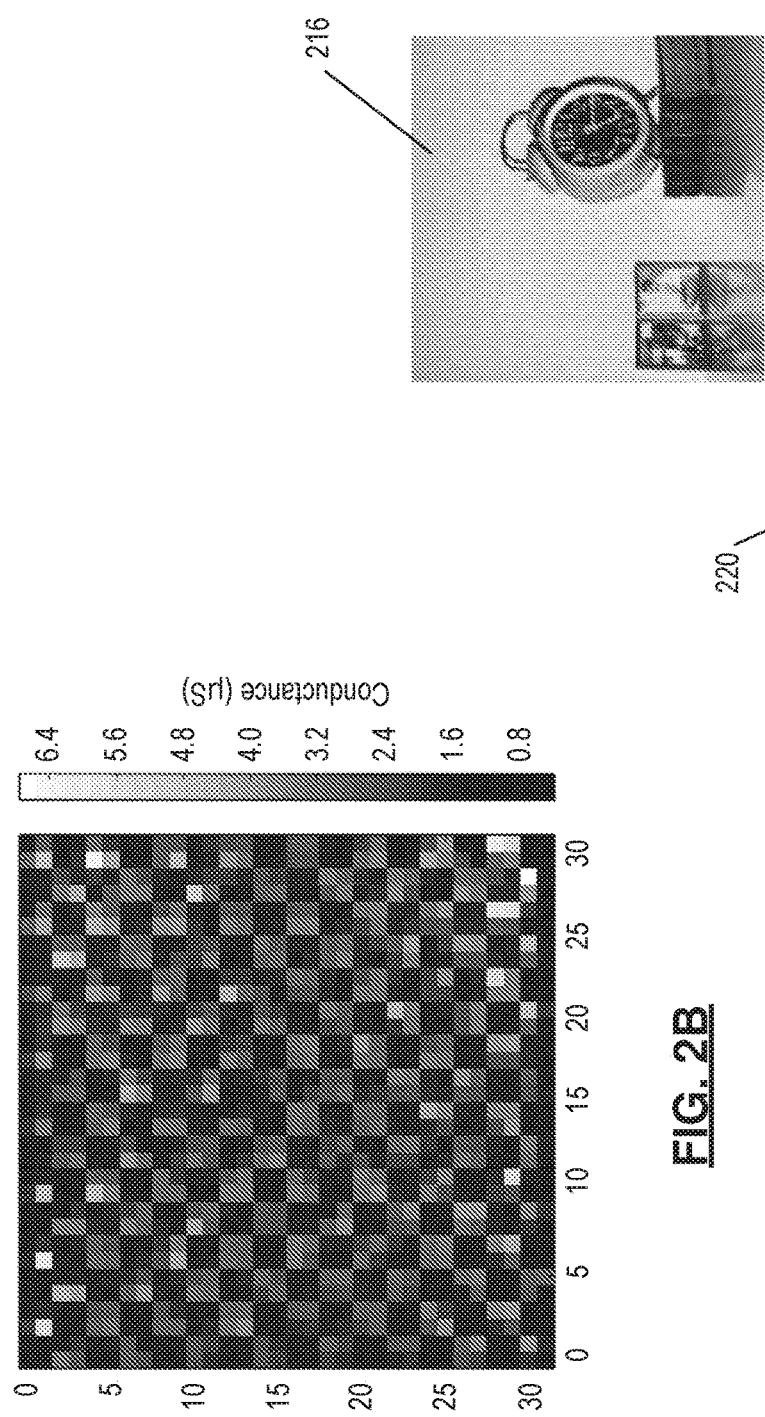
FIG. 2C
FIG. 2B

TECHNIQUES FOR COMPUTING DOT PRODUCTS WITH MEMORY DEVICES

CROSS-REFERENCE TO RELATED APPLICATIONS

This application is a continuation of U.S. patent application Ser. No. 16/235,115, filed Dec. 28, 2018, which is a continuation of U.S. Pat. No. 10,171,084, issued Jan. 1, 2019, which claims the benefit of U.S. Provisional Application No. 62/489,144, filed on Apr. 24, 2017. The entire disclosure of the above identified applications are incorporated herein by reference.

GOVERNMENT CLAUSE

This invention was made with government support under Grant No. HR0011-13-2-0015 awarded by the Department of Defense/Defense Advanced Research Projects Agency. The Government has certain rights in this invention.

FIELD

The present disclosure relates to sparse coding with memristor networks.

BACKGROUND

Memristors, also known as resistive memory devices, are two terminal devices whose resistance values depend on an internal state variable and can be modulated by the history of external stimulation. Unlike conventional charge-based electronic devices, a memristor's state is determined by the internal ion (either cation or anion) configuration, where the re-distribution of oxygen ions or metal cations inside the device modulates the local resistivity and overall device resistance. Memristors have been extensively studied for both digital memory and analog logic circuit applications. At the device level, memristors have been shown to be able to emulate synaptic functions by storing the analog synaptic weights and implementing synaptic learning rules.

When constructed into a crossbar form, memristor networks offer the desired density and connectivity that are required for hardware implementation of neuromorphic computing systems. Recently, memristor arrays and phase change memory devices have been used as artificial neural networks to perform pattern classification tasks. Other studies have shown memristors can be employed in recurrent artificial neural networks for applications such as analog to digital converters. Memristor-based architectures have also been proposed and analyzed for tasks such as sparse coding and dictionary learning. The ability to sparsely encode data is believed to be a key mechanism by which biological neural systems can efficiently process complex, large amount of sensory data, and can enable the implementation of efficient bio-inspired neuromorphic systems for data representation and analysis.

In this disclosure, the implementation of a sparse coding algorithm is demonstrated in a memristor crossbar, and shown that this network can be used to perform applications such as natural image analysis using learned dictionaries.

This section provides background information related to the present disclosure which is not necessarily prior art.

SUMMARY

This section provides a general summary of the disclosure, and is not a comprehensive disclosure of its full scope or all of its features.

A system for sparse coding with an array of resistive memory devices is presented. The system includes an array of resistive memory devices arranged in columns and rows to form a matrix. Each column represents a potential feature of an input. The system also includes an interface circuit electrically coupled to the matrix. The interface circuit cooperatively operates with the array of resistive memory devices to perform computing in the array of resistive memory devices. The interface circuit controls a computation of a first dot product, computes a second dot product, subtracts two values, and computes a third dot product.

The first dot product operation is performed by feeding an input vector forward through the matrix to yield an output vector. The input vector is a column vector with each element representing intensity of a pixel in an image, and the output vector is row vector with each element representing the dot product between the input vector and a feature vector stored in a corresponding column of the matrix. The second dot product operation is performed by feeding a neuron activity vector backward through the matrix to yield an intermediate result vector. The neuron activity vector is a row vector representing a level of activity from all of the neurons in the matrix, and the intermediate result vector is a column vector. The interface circuit then computes a new input vector by subtracting the intermediate result vector from the input vector. The third dot product operation is performed by feeding the new input vector forward through the matrix to yield a new output vector. The output vector is a row vector with each element representing the dot product between the input vector and the feature vector stored in the corresponding column of the matrix.

In various implementations, the interface circuit applies elements of the output vector to the matrix and uses the output vector as the neuron activity vector according to a sparse coding algorithm. The interface circuit evaluates each element of the output vector in relation to a threshold and sets a value of each element in the neuron activity vector to zero when the value of the given element is less than the threshold, and sets a value of each element in the neuron activity vector to a value of the corresponding element of the output vector when the value of the given element is greater than the threshold.

In another aspect, the interface circuit performs neuromorphic computing through the matrix of resistive memory devices in accordance with a locally competitive algorithm. In various implementations, the interface circuit iteratively performs steps described in [0010]-[0011] for a fixed number of iterations. Additionally, the interface circuit may include a counter, and wherein the counter is configured to maintain a count of iterations that indicates a number of iterations performed.

In various implementations, values of the elements in the input vector are represented by voltages applied to the matrix, where the voltage is applied as pulses have a fixed amplitude and a duration proportional to the corresponding value. The intermediate result vector represents a reconstruction of the input. Each data value in the array of resistive memory devices stores a resistance, and the resistance is an element of the feature represented in the column.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 2B is a grayscale representation of different conductance states of each memristor formed at each crosspoint of the matrix;

FIG. 2C is a schematic of the sparse coding concept including an input and a stored dictionary;

Corresponding reference numerals indicate corresponding parts throughout the several views of the drawings.

DETAILED DESCRIPTION

Example embodiments will now be described more fully with reference to the accompanying drawings.

While complex input can be computationally expensive, an array of resistive memory devices, for example, in a field programmable crossbar array (FPCA) matrix, can be used to identify features in the input and remove redundant input and reconstruct the input using a sparse set of data. For example, the input may be an image. Using a forward feed approach, the matrix can receive the input and compare the input to a stored potential feature database. The output of the feedforward approach identifies which features are present in the input, and an output vector representing features in the input data is formed. The output vector indicates the output neurons' activity levels. The neuron activity vector is fed backward through the matrix to reconstruct the input. In sparse coding, the neuron activity vector is sparse (e.g. with many elements set at 0) through neuron inhibition, as discussed later, thus the input can be represented using a smaller amount of data in the sparse representation vector. In this way, the input size can be decreased without sacrificing accuracy and quality of the reconstructed input. The identified features additionally allow efficient analysis of the input data.

Figure 1:
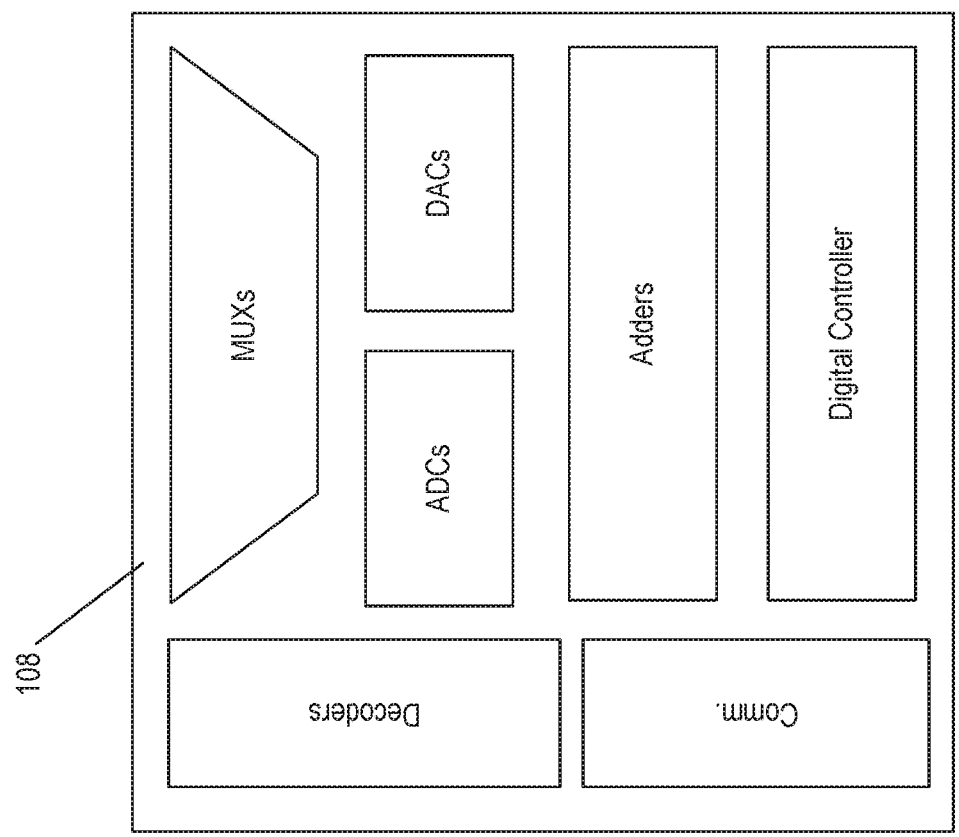
FIG. 1 is a diagram showing example interface circuitry which accompanies a crossbar matrix.
Figure 1:
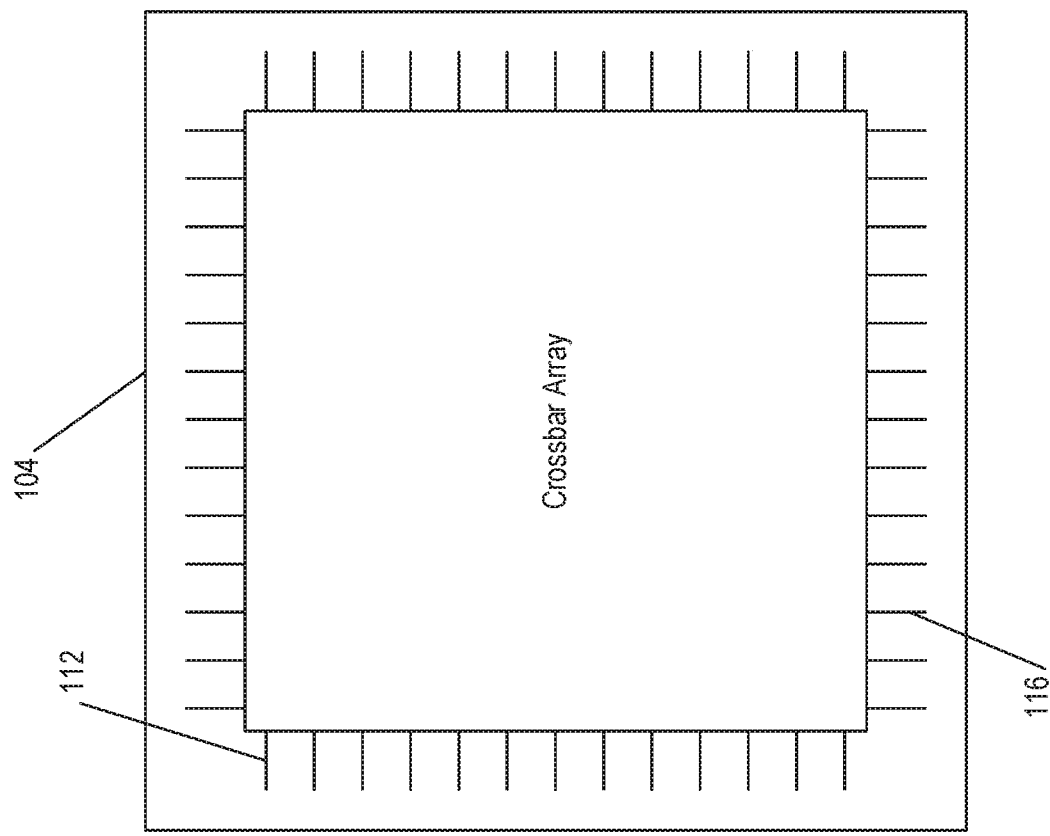

FIG. 1 illustrates a crossbar matrix 104 communicatively coupled to an interface circuit 108. Taking advantage of the monolithic fabrication of the system, the two layers are connected through the very high-density inter-layer vias (ILV). The interface circuit 108 supports storage, digital, and analog computing. The interface circuit 108 has input and output interface circuitries, fabricated in the CMOS layer of FIG. 1. The input circuitry, connected to rows 112 of the crossbar matrix 104, includes decoders and voltage driving circuitry, where the voltage driving circuitry has two modes of operations: binary voltage input and analog voltage input created by digital-to-analog converters (DACs). Also, in the analog mode, the input can be encoded either as a variable pulse width or a variable voltage, as shown by the pulse width in an FCPA matrix 200 of FIG. 2A. Typically, the binary input case is used for memory and arithmetic operations while analog inputs are used to operate the neural network blocks, although this configuration is not exclusive.

The output circuitry, connected to the columns 116 of the crossbar matrix 104, is designed to sense the current of the selected column. The current sensing is achieved with the aid of analog-to-digital converters (ADCs), where the sensing process is the same for all the three major crossbar operations (Storage, Digital, and Analog). The interface circuit 108 operation is controlled by the software layer, through the controller circuitry in the system. For example, if the controller circuitry is asked by the software to access a memory tile, it will activate the binary driving circuitry and collect the ADCs outputs, where currents from all columns 116 in the tile can be read out in a single step.

When the software requests arithmetic operations, the binary driving circuitry will again become activated. However, in this case, the arithmetic operation, managed by the controller circuitry, is carried out over multiple iterations, with examples discussed below. In the case of neural networks operations, the controller will activate the input DACs and collect the output currents from the ADCs, again possible for all columns 116 in a single step, as discussed below. Here, the exact network function and iterations are determined by the software and the algorithm used. In general, the user software defines which function will be performed by the interface circuit 108, with no physical changes to the hardware. The software and the hardware system can also perform dynamic workload distribution over the different functional units to further optimize the system efficiency during runtime. The software commands are implemented in the interface circuit 108 through the controller circuitry.

From the storage point of view, a reliable readout circuit for the crossbar is preferably made of ADCs and digital adders. The same interface circuit 108 can be utilized for digital computing, where the number of bits of the ADC is determined by the tile size. For example, a 32×32 tile requires a small 5-bit ADC. The same interface can also be used to build digital neurons for binary coded neural networks mode of operation. The digital neuron samples the current output and performs the leaky integrate operation using digital adders. In neuromorphic computing implementations, DAC circuitry is used to transform the binary data to an analog input.

Many ADCs contain DACs within its circuitry, which may eliminate the need to implement separate DACs. It is also desirable to keep the crossbar and the CMOS areas balanced, to maximize the die area utilization. Typically, an interface circuit can operate with one tile active at a time instance. For a 32×32 tile, 32 units of ADCs, adders, and DACs are needed. However, having abundant CMOS area, multiple interface circuits can be used to activate multiple tiles at once. This is equivalent to a multi-thread interface circuit. For instance, a state-of-the-art 5-bit ADC requires less than 0.28% of the area of the crossbar matrix 104, if fabricated using 90 nm CMOS technology. This is scaled down to 0.07% in the case of 45 nm fabrication. Finally, it should be noted here that the crossbar MUXs and Decoders can utilize resistive memory devices for their realization enabling fabricating them on the same layer besides the crossbar matrix 104.

The proposed hardware system relies on medium-sized interface circuits to provide computing and storage functionality. Hence, a full system may be composed of many thousands of crossbars and interface circuits.

Figure 2A:
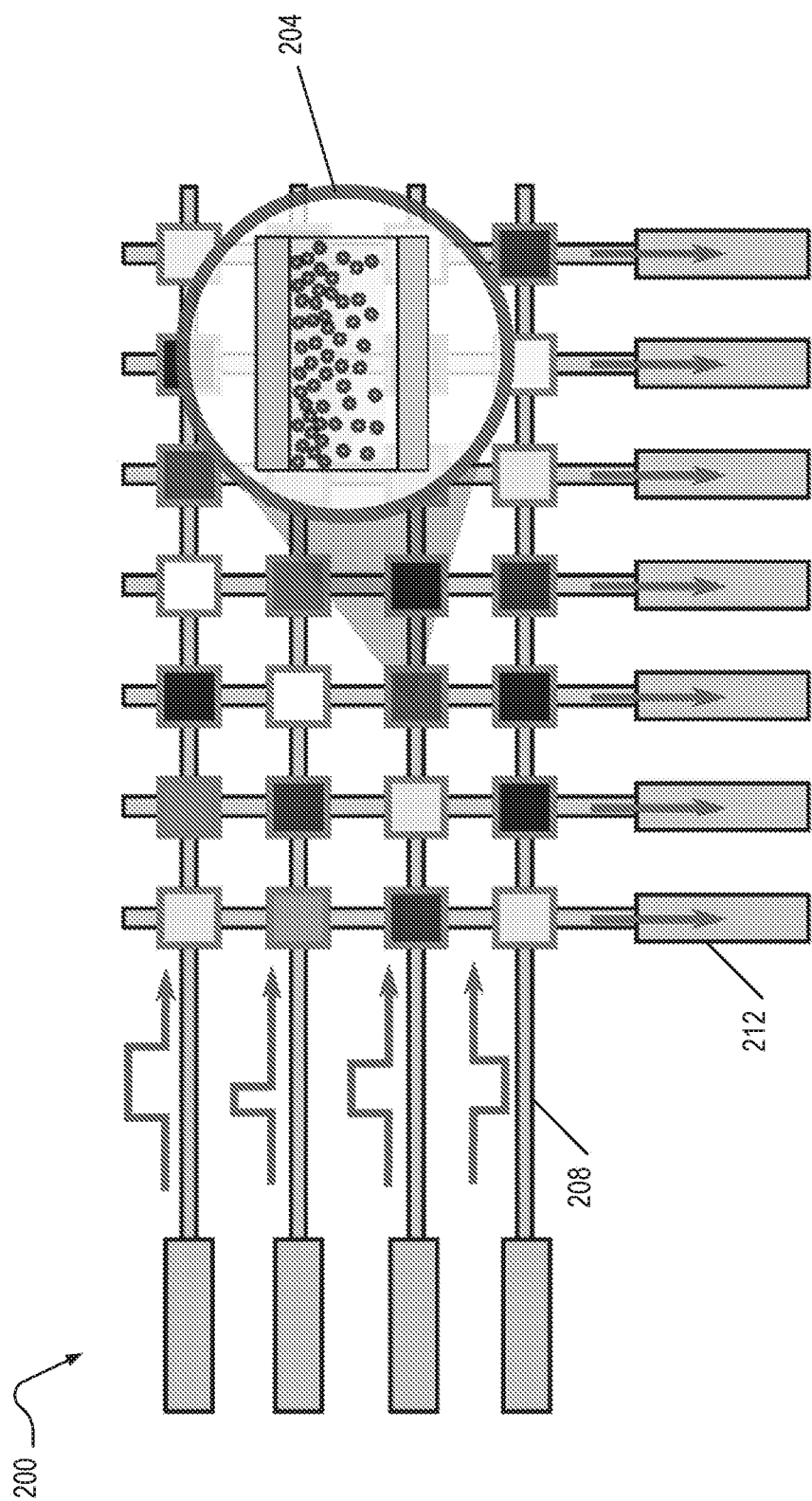
FIG. 2A is a schematic of a memristor crossbar-based computing system.

FIG. 2A depicts the hardware system of the crossbar matrix 200. The matrix 200 is based on a 32×32 crossbar matrix of WOx-based analog memristors 204, formed at each intersection in the crossbar. FIG. 2A shows input 208, such as input neurons, are input at each row of the matrix. Leaky-integrating output 212, such as output neurons, are output from the matrix 200 at each column of the matrix 200. A memristor 204 is formed at each crosspoint, and can be programmed to different conductance states, represented in grayscale in FIG. 2B, by controlling the internal ion-redistribution (inset). FIG. 2C illustrates a schematic of the sparse coding concept, where an input 216 (e.g., the image of a clock) can be decomposed into and represented with a minimal number of features (also called dictionary elements) 220 that can be stored in the matrix 200 for comparison to the input data 208. The terms column and row are used throughout the present application merely for illustration purposes. Instead, the terms row and column are used in relation to each other throughout the present application. That is, in various implementations, a column may be a row and a row may be a column.

The matrix devices are fabricated using e-beam lithography following previously developed procedures. After fabrication, the crossbar matrix is wire-bonded and integrated on a custom-built testing board, enabling random access to single or multiple memristors simultaneously, for sending and retrieving signals from the crossbar matrix. Specifically, the memristors can be programmed into different conductance states and can be used to modulate signals in either forward (when the read voltage is applied to the rows and current is measured at each column) or backward directions (when the read voltage is applied to the columns and current is measured at each row). Further details regarding this example hardware system may be found in U.S. patent application Ser. No. 15/723,668 filed on Oct. 3, 2017 and entitled "Field-Programmable Crossbar Array For Reconfigurable Computing," which is incorporated by reference in its entirety. While reference is made to this particular hardware system, it is understood that other types of hardware systems may be used to implement the sparse coding techniques set forth below.

The original input 208, such as an image, is fed into the rows of the memristor crossbar, i.e., the matrix 200, and the columns of the crossbar are connected to output 212, such as the output neurons. The matrix 200 performs critical pattern matching and neuron inhibition operations to obtain a sparse, optimal representation of the input. After the memristor network stabilizes, the re-constructed image can be obtained based on the (sparse) output neuron activities and the features stored in the crossbar matrix. A component of sparse coding is the ability to exert inhibition among neurons to re-construct the input 208 using an optimized set of features (out of many possible solutions). In the present application, the lateral neuron inhibition is achieved using iterations of forward and backward passes in the same matrix network in discrete time domain, without having to physically implement inhibitory synaptic connections between the output neurons.

To verify the operation of the crossbar matrix, a 32×32 greyscale image (i.e. a checkerboard pattern with 2×2 patch size) is written and read-out from the system, as shown in FIG. 2B. A single programming pulse is used to program each device without a read-verify procedure, demonstrating the system's capability to program and store analog weights in the crossbar matrix.

Sparse representation reduces the complexity of the input signals 208 and enables more efficient processing and storage, as well as improved feature extraction and pattern recognition functions. Given a signal, x, which may be a vector (e.g., representing the pixel values in an image patch), and a dictionary of features, D, the goal of sparse coding is to represent x as a linear combination of features from D using a sparse set of coefficients a, while minimizing the number of features used. A schematic of sparse coding is shown in FIG. 2C, where an input (e.g. the image of a clock) is formed by a few features 220 selected from a large dictionary. The objective of sparse coding can be summarized mathematically as minimizing an energy function, defined in equation 1, shown below:

$$\min_a(|x-Da^T|_2+\lambda|a|_0) \quad (1)$$

where $|\bullet|_2$, and $|\bullet|_0$ are the $L^2$- and the $L^0$-norm, respectively. The first term measures the reconstruction error, which is the difference between the original signal x and the reconstructed signal $Da^T$ using the features in the dictionary D and the activity vector a, while the second term measures the sparsity which is reflected by the number of active elements in a used to reconstruct the input. Unlike many compression algorithms that focus on reconstruction error only, sparse coding algorithms reduce complexity by assuming that real signals lie in only a few dimensions (of a high dimensional space) and attempt to find an optimal representation that also reduces dimensionality. As a result, sparse coding not only enables more efficient representation of the data, but may also be more likely to identify the "hidden" constituent features of the input and thus can lead to improved data analyses such as pattern recognition.

Several sparse coding algorithms have been developed, and this work focuses on the Locally Competitive Algorithm (LCA) for its advantages in encoding spatiotemporal signals, biological plausibility, and compatibility with the crossbar architecture. Further description for this algorithm may be found in an article by Rozell, C. J., Johnson, D. H., Baraniuk, R. G. & Olshausen, B. A. Sparse Coding via Thresholding and Local Competition in Neural Circuits. *Neural Comput.* 20, 2526-2563 (2008) which is incorporated by reference in its entirety. In this approach, the membrane potential of an output neuron is determined by the input, a leakage term, and an inhibition term that helps achieve sparsity by preventing multiple neurons with similar features from firing simultaneously. Mathematically it can be shown that the lateral neuron inhibition can be achieved through an iterative approach by removing the reconstructed signal from the input to the network (see Equations (2)-(3) below).

The LCA solves the minimization problem (equation (1)) using a network of leaky-integrator neurons and connection weights. In this implementation, x is an m-element column vector, with each element corresponding to an input element (e.g. intensity of a pixel in an image patch). D is an m×n matrix, where each column of D represents an m-element feature vector (i.e. a dictionary element) and connected to a leaky-integrator output neuron (FIG. 2A). a is an n-element row vector representing the neuron activity coefficients, where the i-th element of a corresponds to the activity of the i-th neuron. After feeding input x to the network and allowing the network to stabilize through lateral inhibition, a reconstruction of x can be obtained as $Da^T$, i.e. linear combination of the neuron activities and corresponding neurons' feature vectors. In a sparse representation only a few elements in a are nonzero while the other neurons' activities are suppressed to be precisely zero.

The neuron dynamics during LCA analysis can be summarized by the following equation (2).

$$\frac{du}{dt} = \frac{1}{\tau}(-u + x^T D - a(D^T D - I_n)) \quad (2a)$$

$$a_i = \begin{cases} u_i & \text{if } u_i > \lambda \\ 0 & \text{otherwise} \end{cases} \quad (2b)$$

where $u_i$ is the membrane potential of neuron i, τ is a time constant, and $I_n$ is the n×n identity matrix.

During the LCA analysis, each neuron i integrates the input $x^T D$, leakage $-u_i$ and inhibition $a(D^T D - I_n)$ terms and updates its membrane potential $u_i$ (equation (2a)). If and only if $u_i$ reaches above a threshold (set by parameter λ), neuron i will produce an output $a_i = u_i$, otherwise the neuron's activity $a_i$ is kept at 0 (equation (2b)). Specifically, the input to neuron i (second term in equation (2a)) is determined by the input signal x scaled by the weights $D_{ji}$ connected to the neuron. In this regard, the collection of synaptic weights $D_{ji}$ associated with neuron i, representing the feature vector associated with neuron i, is also referred to as the receptive field of neuron i, analogous to the receptive fields of biological neurons in the visual cortex.

According to the LCA, the neurons also receive inhibition from other active neurons (the last term in Equation (2a)), an important observation in biological neural systems. The LCA incorporates this competitive effect through the inhibition term that is proportional to the similarity of the neurons' receptive fields (measured by $D^T D$ in Equation 2a). The inhibition term prevents multiple neurons from representing the same input pattern and allows the network to dynamically evolve to find an optimal output. Note that when a neuron becomes active, all other neurons' membrane potentials will be updated through the inhibition term (to different degrees depending on how similar the neurons' receptive fields are). As a result, an initially active neuron may become suppressed and a more optimal representation that better matches the input may be found. In the end the network evolves to a steady state where the energy function (Equation 1) is minimized and an optimized sparse representation (out of many possible solutions) of the input data is obtained, from a combination of the stored features and the activities of the (sparse) active neurons.

However, implementing the inhibition effect $D^T D$ can be very computationally intensive. On the other hand, the original Equation 2a can be re-written into Equation 3, shown below:

$$\frac{du}{dt} = \frac{1}{\tau}(-u + (x - \hat{x})^T D + a) \quad (3)$$

where $\hat{x} = Da^T$ is the signal estimation or the reconstructed signal. Equation 3 shows that the inhibition term between neurons can be reinterpreted as a neuron removing its feature from the input (second term in Equation 3) when the neuron becomes active, thus suppressing the activity of other neurons with similar features. By doing so, the matrix-matrix operation $D^T D$ in Equation 2a is reduced to two sequential matrix-vector dot-product operations. One is used to calculate $\hat{x} = Da^T$ and the other is used to calculate the contribution from the updated input $(x - \hat{x})^T D$, which an be efficiently implemented in the matrix 200 in discrete time domain without physical inhibitory synaptic connections between the neurons.

In the LCA, a vector of signal inputs (i.e. image pixels) is used to excite the network. In one implementation, the input values (such as the intensity of pixels in a gray-scale image) are translated to voltage pulse durations with a fixed voltage amplitude, so that the total charge passed through the memristors is linearly proportional to the input, weighted by the memristor conductance. For each output neuron, the crossbar modulates the inputs with a synaptic weight vector (represented by each conductance of the memristors in the same column) and converts them into currents that flow into the neuron. In this sense, the crossbar matrix performs the matrix dot-product operation $x^T \cdot D$ through a single read operation, where the vector-matrix multiplication operation is performed in parallel. Here x is the input vector and D is the memristor weight matrix.

Figure 3B:
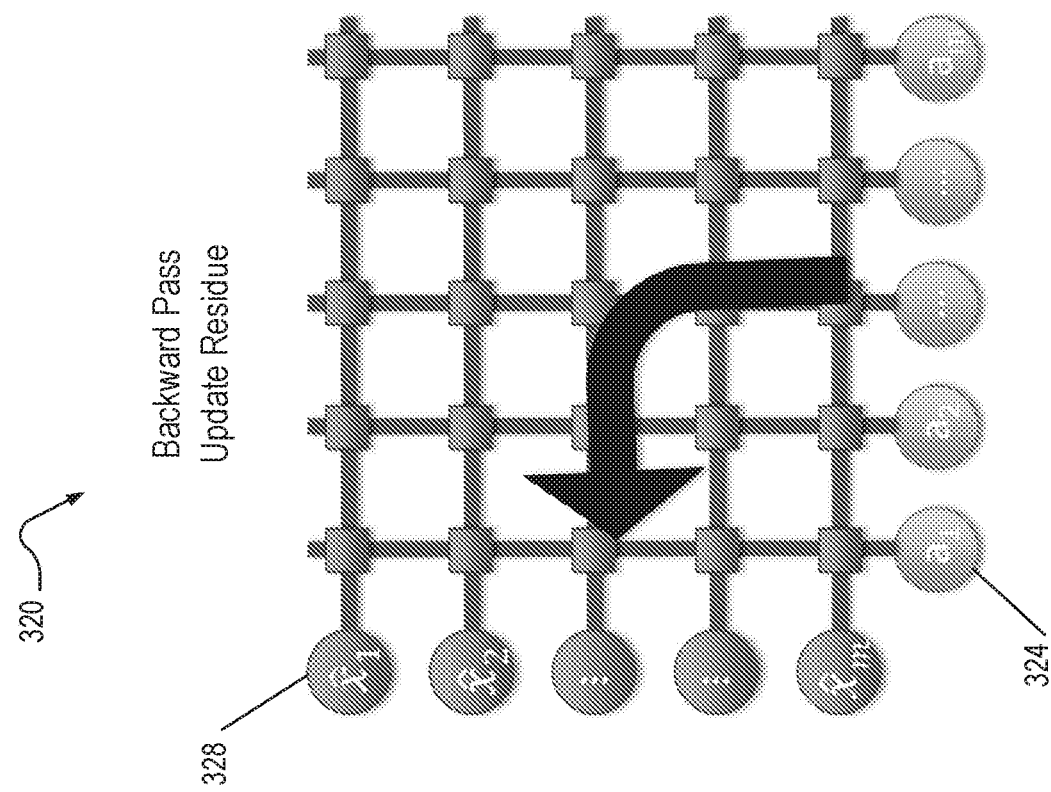
FIG. 3B depicts a backward pass of a matrix, where an updated output is being applied to columns of the matrix to produce a new input at the rows of the matrix.
Figure 3A:
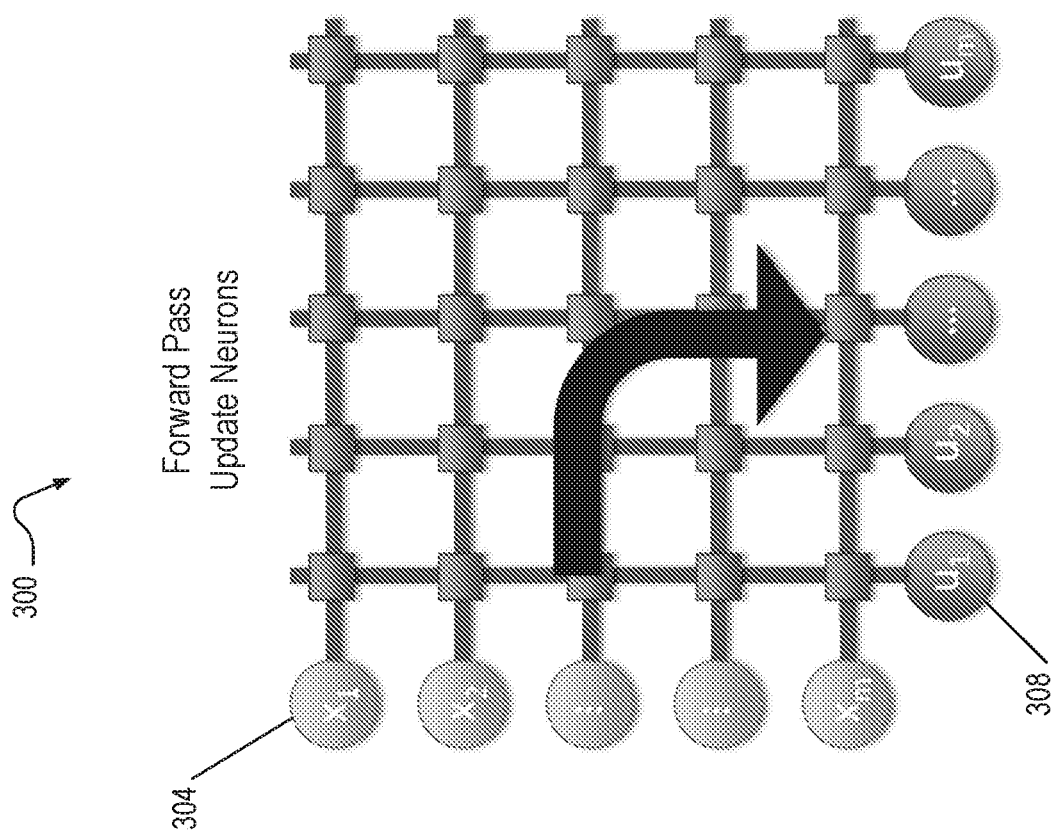
FIG. 3A depicts a forward pass of a matrix, where an input is being applied to rows of the matrix to produce an output at columns of the matrix.

After converting the input through the memristor weight matrix by feeding the input forward through the matrix, the obtained current is then integrated to determine the neuron's membrane potential, as shown in FIG. 3A. Additionally, in LCA the membrane potential is affected by a leakage term, as well as inhibition from other active neurons. The inhibition effect is an important component of LCA and the strength of the inhibition is proportional to the similarity of the neurons' receptive fields (feature vectors). This effect is critical in ensuring sparsity by preventing duplicate neurons from firing with the same/similar receptive fields. Mathematically, the neuron's membrane potential dynamics is determined by Equation 4, shown below:

$$\frac{du}{dt} = \frac{1}{\tau}(-u + x^T \cdot D - a \cdot (D^T D - I)) \quad (4)$$

In Equation 4, a is the activity of the neuron. In conventional approaches (e.g. GPU or digital or mixed-signal CMOS circuits), the inhibition is achieved by either computing $D^T D$ on the fly which is very compute-intensive, or by storing all the inhibition weights $D^T D$ in a separate "feedback" memory. However, since inhibition is all-to-all, the feedback memory scales with $n^2$, where n is the number of output neurons and will grow very fast and become impractical as the input becomes larger. In various implementation. Equation 4 is re-written as Equation 5, shown below:

$$\frac{du}{dt} = \frac{1}{\tau}(-u + (x-\hat{x})^T D + a) \quad (5)$$

where the original input $x^T$ is replaced with $(x-\hat{x})^T$ (the residual term), where $$\hat{x} = Da^T \quad (6)$$

is the reconstructed signal based on the activities of the output neurons a and the receptive field matrix D. The residual term is then fed to the network as the new input. The approach of the present application equivalently achieves inhibition since the features associated with the active neurons are now removed from the input, so the membrane potentials of neurons with similar receptive fields as the active ones will be suppressed. This process eliminates calculating $D^T D$ or the feedback memory, but it requires the dot-product operation of the neuron activity vector a and the transpose of the weight matrix $D^T$, which are again very compute-intensive. However, with the memristor network, the operation $a \cdot D^T$ can also be readily implemented by a single operation by feeding the neuron activity vector a backwards through the matrix, as shown in FIG. 3B, where the vector-matrix multiplication $a \cdot D^T$ can be achieved through a single read at the input. The new input $(x-\hat{x})^T$ will then be calculated, and forward-feed into the matrix and this process is repeated until the network settles and a sparse representation of the original input can be obtained from the activity vector a.

During an experimental implementation, the time constant for the leaky integrating neuron ($\tau$ in Equations 2a and 5) was chosen to be 60. The choice of $\tau$ needs to balance system stability with coding efficiency. A lower $\tau$ causes neurons to charge and leak more quickly which can yield a sparse code in fewer iterations of the algorithm, but can also cause neurons to oscillate near the threshold. A $\tau$ of 60 allowed the sparse code to be obtained within 60 iterations while allowing the network to stabilize with neurons settling either above or below the threshold.

In various implementations, the neuron circuit is implemented digitally in software, using discrete time steps according to Equations 5 and 6. The unit of $\tau$ is the time step used in the discrete time implementation, i.e. $\tau=60$, meaning the integration and decay time constant in Equation 5 is 60 time steps. The duration of each time step can be calculated from the unit read pulse width (i.e., 60 us) and the input/output numbers. Counting both the forward and backward read cycles, the physical time for each time step is approximately 2.88 milliseconds using the test board. This time can be significantly improved using integrated circuitry.

From Equation 5, the membrane potential u may have the same unit as the vector-matrix multiplication output (simply referred as dot-product for convenience) $x^T D$. The vector-matrix dot-product was calculated by measuring the total charge of a forward read pass, which can be written and measured as $G^T V t$, where G, V, and t represent conductance, voltage, and pulse width, respectively. As a result, the membrane potential has a unit of charge. In other implementations of using voltage to represent input, the output will have a unit of current. A typical value of the membrane potential can be estimated. G has conductance values of 3~7 uS, V is 0.6 V, the minimum pulse width is around 60 µs during the forward and backward passes, leading to membrane potential values on the level of 1e-10 C in one implementation.

The sparse coding algorithm was experimentally implemented in the memristor array-based artificial neural network (i.e., the crossbar matrix). Memristor crossbars are particularly suitable for implementing neuromorphic algorithms since the matrix-vector dot-product operations can be performed through a single read operation in the crossbar matrix. In this approach, the dictionary, D, is directly mapped element-wise onto the memristor crossbar with each memristor at row i and column j storing the corresponding synaptic weight element $D_{ij}$. The input vector x (e.g. pixel intensities of an input image) is implemented with read pulses with a fixed amplitude and variable width proportional to the input data value. As a result, the total charge $Q_{ij}$ passed by a memristor at crosspoint (i,j) is linearly proportional to the product of the input data $x_i$ and the conductance $D_{ij}$ of the memristor $Q_{ij}=x_i D_{ij}$, and the charge passed by all memristors sharing column j is summed via Kirchhoff's current law $Q_j = \Sigma_i x_i D_{ij} = x^T D_j$. In other words, the total charge accumulated at neuron j is proportional to the dot-product of the input x with the neuron's receptive field $D_j$. Since the dot-product of vectors measures how close the input vector is matched with the stored vector, the ability to implement this operation in a single read process allows the memristor network to conveniently and efficiently perform this important pattern matching task. This term ($x^T D$ in vector form) is then added to the neuron's membrane potential. If the membrane potential is above threshold $\lambda$ following equation (2), the neuron is active for the next phase.

In the second phase, the input data is reconstructed using the currently active neurons and compared with the original input. This is accomplished by performing a "backward read." Variable width read pulses, proportional to the neurons' activities $a_j$, are applied on the columns while the charge is collected on each row i to obtain $Q_i = \Sigma_j D_{ij} a_j = D_i a^T$. This backward read has the effect of performing a weighted sum of the receptive fields of the active neurons directly through the transpose of the weight matrix, and the total integrated charge on the rows is proportional to the intermediate reconstructed signal $\hat{x}=Da^T$ in vector form. The difference of x and $\hat{x}$, referred to as the residual, is used as the new input to the crossbar matrix to obtain an updated membrane potential based on equation (3). The forward and backward processes are repeated, alternately updating the neuron activities and then the residual. Experimentally, after collecting charges from the crossbar matrix in each step, the neuron activities and membrane potentials are updated by an field-programmable gate array (FPGA) board in the measurement setup. After the network has stabilized, a sparse representation of the input, represented by the final output activity vector a, is obtained. By performing these forward and backward passes in the same memristor network in discrete time domain, lateral inhibition required by the sparse coding algorithm can be effectively achieved without having to implement physical inhibitory synaptic connections between neurons.

FIG. 3A illustrates a forward pass 300 of a matrix, where an input $x_i$ is being applied to rows 304 of the matrix to produce an output $u_j$ at columns 308 of the matrix. The input $x_i$ is a column vector, where each element of the column vector is a different input. The rows 304 of the matrix can each accept a different element of the input $x_i$. The output $u_j$ is a row vector. Each element of the output vector corresponds to a dot-product of the input vector x and a feature vector in the matrix. When performing a forward pass 300, the input x is fed into the rows 304 and a corresponding output $u_j$ is produced at one of the columns (e.g. column j) 308. The output $u_j$ of the forward pass 300 represents a similarity between the input x applied at the rows 304 and the feature stored in column j in the crossbar matrix, representing the library D. That is, the elements in the output u at the columns in 308 indicates how similar the input x is to the potential features stored in the matrix.

FIG. 3B illustrates a backward pass 320 of a matrix, where the neuron activity vector a is being applied to columns 324 of the matrix to produce the reconstructed input $\hat{x}$ at the rows 328 of the matrix.

The activity vector a is obtained after the forward pass 300 is complete. Before performing the backward pass 320, each output from the forward pass 300 is compared to a threshold value. For example, if one of the outputs, for example, $u_1$, is less than the threshold value, the corresponding element $a_1$ of the activity vector may be set to zero. In various implementations, the threshold value represents a limit at which how many neurons in the network may become active, thus eliminating redundant neurons from being active and represented. Therefore, the input $a_1$ of the backward pass 320, also known as a neuron activity vector, is set to zero when the output $u_l$ from the forward pass 300 indicates that a corresponding input $x_1$ is redundant.

For each element of the output $u_i$ that is higher than the threshold value, the corresponding output is put into a corresponding element of the neuron activity value $a_i$. The neuron activity vector a is fed into the matrix through the backward pass 320 at the columns 324 of the matrix. An intermediate result vector or a reconstructed input $\hat{x}_i$ is produced at the rows 328 of the matrix. The reconstructed input $\hat{x}$ can be subtracted from the input $x_i$ of the forward pass 300 to calculate a new input $(x-\hat{x})$. In various implementations, the new input $(x-\hat{x})$ is used in a subsequent forward pass, where the forward pass and the backward pass are performed iteratively until the network is stabilized.

Figure 4:
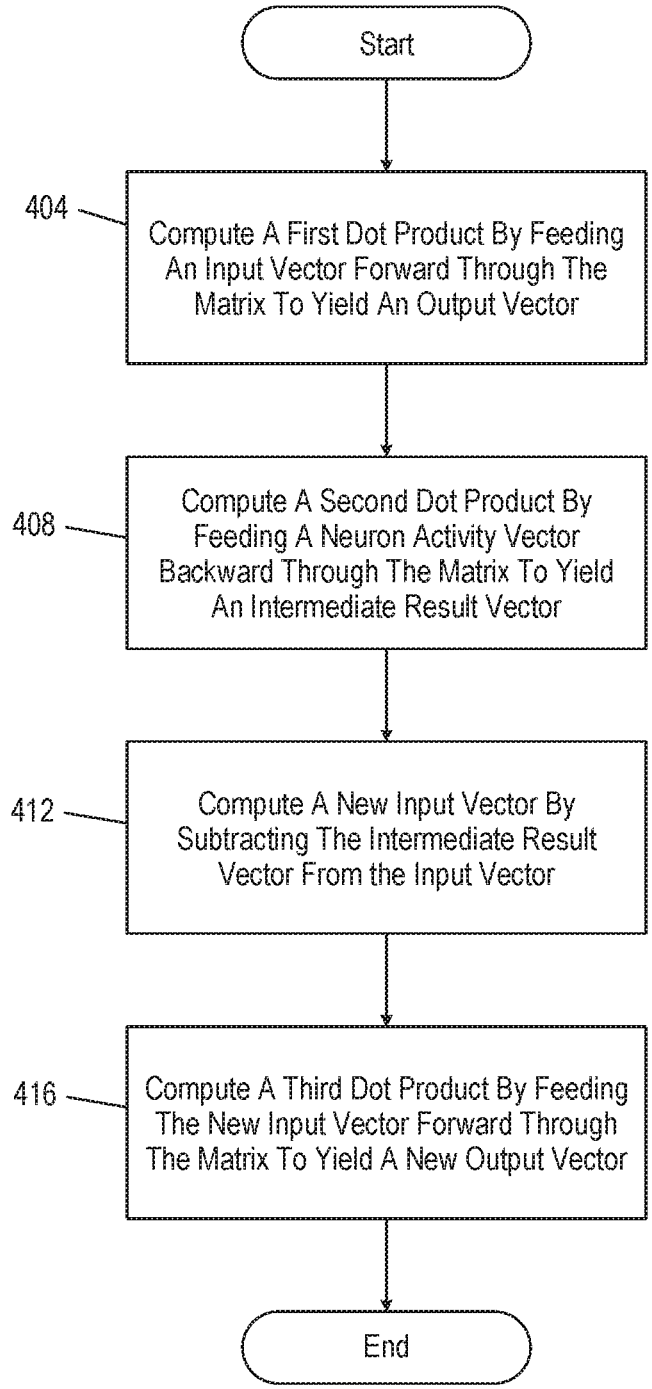
FIG. 4 is a flowchart depicting computation of a reconstructed input according to a forward pass and a backward pass.

FIG. 4 is a flowchart depicting computation of a reconstructed input according to a forward pass and a backward pass. Control begins at 404, where the interface circuit controls the computation of a first dot product. The first dot product is computed by feeding an input vector x forward through the matrix, as described in FIG. 3A. After the forward pass, the matrix yields an output vector u. As described previously, after the forward pass, the output vector u may be adjusted into a neuron activity vector a. To determine the neuron activity vector a, each element of output vector u is compared to the threshold value. Each element of the output vector u that is lower than the threshold value is then set to zero in the neuron activity vector a.

After the forward pass of step 404 is complete, control continues to 408. At 408, the interface circuit controls the computation of a second dot product. The second dot product is computed by feeding the neuron activity vector a backward through the matrix to yield an intermediate result vector $\hat{x}$. As previously described, the intermediate result vector $\hat{x}$ represents a reconstructed input. After the backward pass at 408, control continues to 412. At 412, the interface circuit controls the computation of a new input vector $(x-\hat{x})$. The new input vector $(x-\hat{x})$ is equal to the input x minus the intermediate result vector R. Control continues to 416, where the interface circuit controls the computation of a third dot product. The third dot product is computed by feeding the new input vector $(x-\hat{x})$ forward through the matrix to yield a new output vector. Similar to the output vector u described above, the new output vector represents a similarity between the new input and the potential features stored in the matrix.

Figure 5:
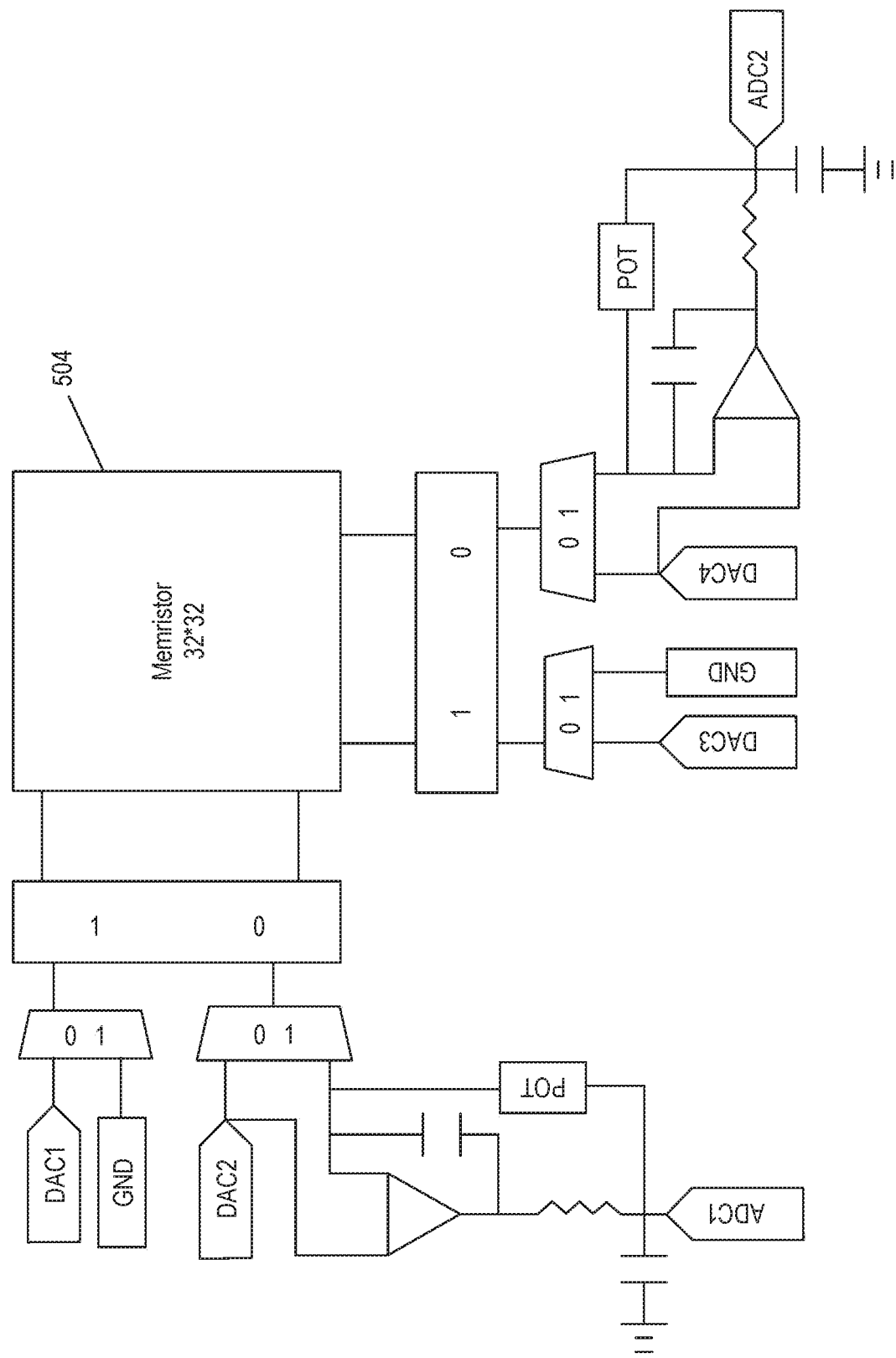
FIG. 5 is a functional block diagram of a test board implementing the sparse coding device.

FIG. 5 is a functional block diagram of a test board implementing the sparse coding device. Specifically, FIG. 5 shows a schematic of the matrix 504 along with an optical micrograph of the test board with an integrated memristor chip. The setup can measure arrays in sizes of up to 32 rows and 32 columns and perform a broad range of tests and array operations. The potential features stored in the matrix 504 can be reconfigured and updated. For example, single pulses with different pulse widths may be used to program memristor resistance of each crossbar of the matrix 504. That is, varying pulse widths may be used to reconfigure potential features stored in the matrix 504.

In various implementations, images composed of diagonally oriented stripe features using the algorithm given above were encoded to the matrix 504. The dictionary, e.g. the dictionary elements 220 shown in FIG. 2C, may contain 20 stripe features with each feature consisting of 25 weights. The 20 features may be written into the 20 columns (with each weight represented as a memristor conductance) and the inputs may be fed into 25 rows. In an example test, an image consisting of a combination of 4 features was used as a test input to the system. A total of 30 forward-backward iterations, as described earlier, were performed to stabilize the sparse-coding network and reconstruct the final reconstructed signal. The input image was correctly reconstructed using a subset of neurons corresponding to the native features of the input, weighted by their activities. Additionally, the experimental setup allows the study of network dynamics during the sparse-coding analysis by plotting the membrane potential values for all 20 neurons during the iterations.

The re-programmability of memristors allows the dictionary set to be readily adapted to the type of signal to be encoded, so the same memristor hardware system can process different types of inputs using a single general approach. To demonstrate this point, a new dictionary composed of horizontally and vertically oriented bars was reprogrammed into the same crossbar matrix in the example above. By using this new dictionary, images consisting of bar patterns can be efficiently analyzed using the same algorithm.

A custom board was designed to test crossbar matrix for neuromorphic computing applications including the sparse coding tasks. The board can apply timed voltage pulses and measure currents at both row and column terminals, with an integrated controller system to perform these tasks in an automated manner. It can measure crossbar matrices in sizes of up to 32 rows and 32 columns. There are four digital to analog converters (DACs) capable of independently producing voltage pulses with amplitude ranges from −5V to 5V. Typically, two voltage sources are connected to the rows through the matrix switches, and two to the columns. The matrix switches are connected in such a way as to perform 2×32 routing, with a 32-bit binary word used to configure which of the rows (columns) is connected to DAC0 (DAC2) while the remaining rows (columns) are connected to DAC1 (DAC3). The board can perform multiple tests to characterize memristor devices including DC sweeps, pulse measurements, and importantly, random read and write procedures for crossbar matrices. A virtual ground with negative feedback is used to convert the current flowing to an output electrode to a voltage that can be read by the analog to digital converters (ADCs). A variable resistor in the path is used to control the amplification of the current signal. A multiplexer is included in the signal path to allow connection of either the virtual ground or the DAC. All control and data signals are passed through logic level shifters so that the signals can be communicated between the board (at 5 V level) and off-board (at 3.3 V).

The algorithm is programmed onto the board with a mixture of Python and C code. The Python functions direct the pre-processing and compilation of C routines and download the compiled binaries to the board. The generated data are received using Python functions, and displayed with the Matplotlib library. Algorithm execution is directed by the Python code to reduce the processing load on the soft microcontroller, while board control C routines benefit the real-time execution of the microcontroller.

Low level board tasks such as setting the output voltages and configuring the matrix switches were written exclusively in C using memory-mapped control registers while higher level functions such as reading a crossbar matrix or programming a pattern were written in a mixture of C and Python. C code templates were developed to execute generic tasks. The Python code acted as a preprocessor for these templates, filling in parameters such as hexadecimal values corresponding to a voltage or 32 bit configurations for the matrices. A soft microprocessor was implemented on the Opal Kelly™ XEM6010 FPGA on the test board using AltOR32 OpenRISC architecture. The SConstruct build tools were used to control compilation and linking C codes into binaries, which was performed by the or1knd-toolchain developed for AltOR32. The binaries were then downloaded onto the board and executed.

Figure 6:
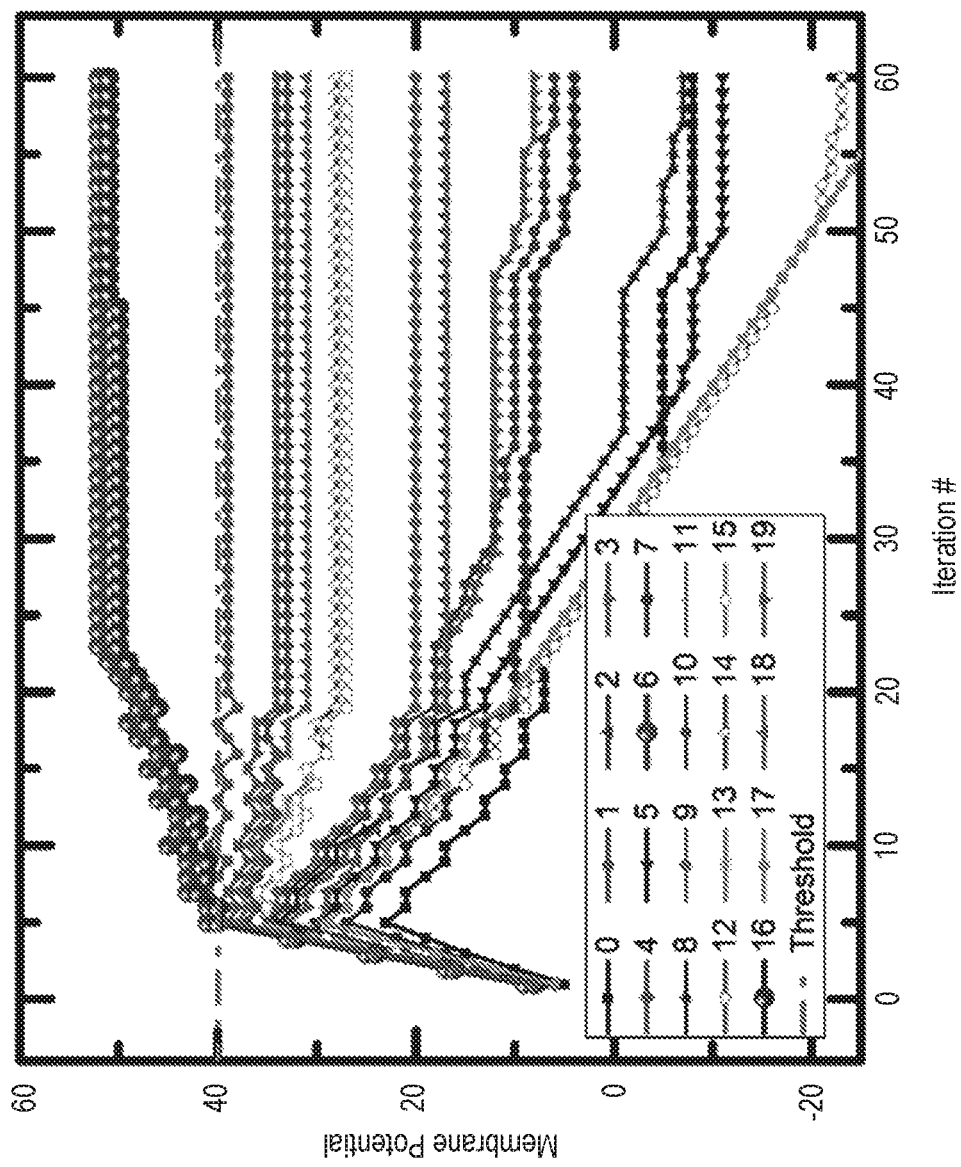
FIG. 6 depicts an original and reconstructed image based on dynamics of neurons 6 and 16 during LCA analysis.
Figure 6:
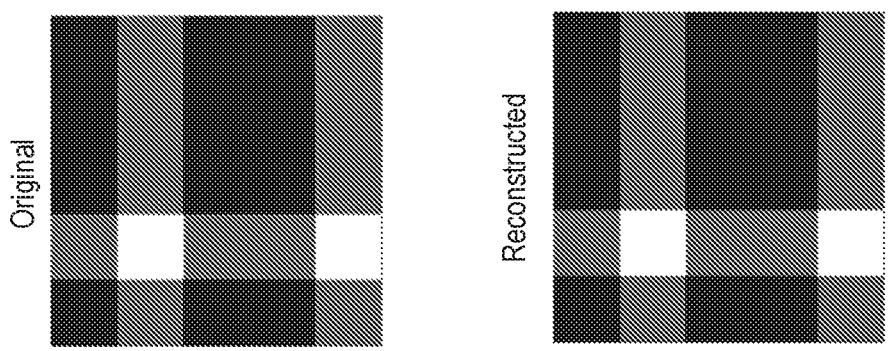

FIG. 6 depicts an original and the reconstructed image based on dynamics of neurons 6 and 16 during LCA analysis using the crossbar array and the test board. Neuron 6 is the highest line depicted in the graph showing membrane potential versus iteration number (one iteration corresponding to a forward pass step followed by a backward pass step), while neuron 16 is the second highest line. As described above, the original input is forward fed into the matrix to yield an output. Each output is then compared to a threshold value. The elements that fall below the threshold value are set equal to zero while the element equal to or above the threshold remain unchanged. The updated output, also called a neuron activity vector, is fed backward through the matrix to yield the reconstructed input. A new input is calculated by subtracting the reconstructed input from the input. Then, the feed forward and feed backward operations are performed for a predetermined number of iterations. As shown in FIG. 6, the operations are performed 40 times to calculate the reconstruction shown in FIG. 6.

Figures 7A, 7B:
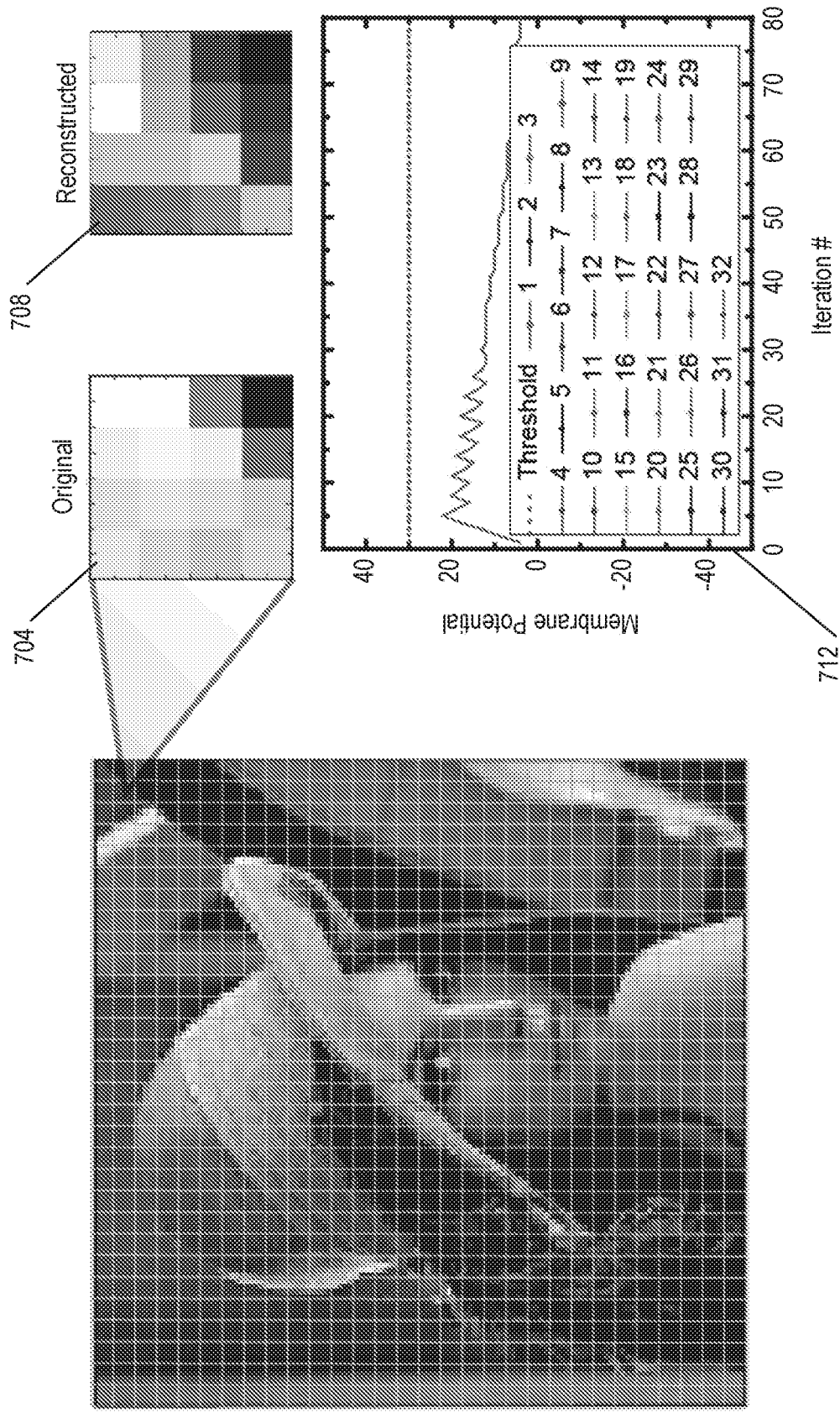
FIG. 7A is an original 120×120 image.
FIG. 7B is a 4×4 patch from the original image, an experimentally reconstructed patch, and a graph depicting membrane potentials of the neurons as a function of iteration number during LCA analysis.
Figure 7D:
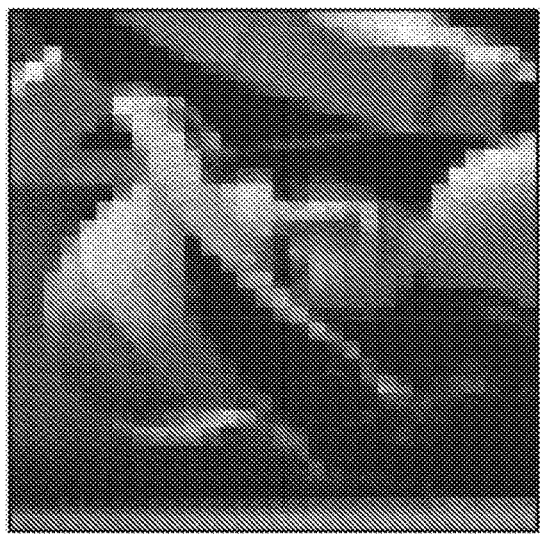
FIG. 7D is a simulated reconstructed image using offline trained dictionary based on Winner-Take-All.
Figure 7F:
FIG. 7F is a simulated reconstructed image by considering realistic device variabilities during online learning. 8×8 patches.
Figure 7C:
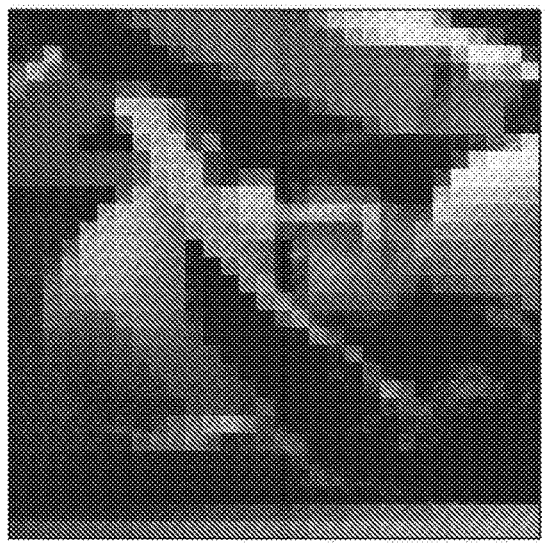
FIG. 7C is an experimentally reconstructed image based on the reconstructed patches.

FIGS. 7A through 7H generally depict natural image processing using the crossbar matrix-based hardware system. FIG. 7A illustrates an original 120×120 image. The image is divided into non-overlapping 4×4 patches for processing in this example. Using the trained dictionary, reconstruction of grayscale images was successfully performed experimentally using the 16×32 memristor crossbar. During the process, the input image of FIG. 7A was divided into 4×4 patches and each patch was experimentally processed using the memristor crossbar based on the sparse-coding algorithm. FIG. 7B illustrates a 4×4 patch from the original image 704 as well as an experimentally reconstructed patch 708 from the 16×32 memristor crossbar using the LCA algorithm and an offline-learned dictionary based on Winner-Take-All. A graph of FIG. 7B illustrates membrane potentials of the neurons as a function of iteration number during LCA analysis. After the memristor network stabilized, the original patch 704 was reconstructed 708 using the neuron activities and the corresponding receptive fields. The complete image was then composed from the individual patches. FIG. 7C illustrates the experimentally reconstructed image based on the reconstructed patches.

Figure 7E:
FIG. 7E is a simulated reconstructed image using larger patches and an ideal dictionary learned via sparse coding and gradient descent.

FIG. 7D illustrates a simulated reconstructed image using offline trained dictionary based on Winner-Take-All. FIG. 7E illustrates a simulated reconstructed image using larger patches and an ideal dictionary learned via sparse coding and gradient descent. FIG. 7F illustrates a simulated reconstructed image by considering realistic device variabilities during online learning. During training and the reconstruction of FIGS. 7E and 7H, 8×8 patches were used.

To verify the experimental results, detailed simulations of the memristor crossbar network were performed. Effects including device variations were carefully considered during the initialization of the matrix and during the weight updates. In FIG. 7C, non-idealities during the dictionary storage were simulated based on the weight update equation. Image reconstructions were then analyzed using the simulated memristor network, following the same procedure as the experimental processes. The simulation results consistently reproduced the experimental results (FIG. 7D) for this image processing task.

The experimental results are limited by the network size in this demonstration so that only 4×4 patches are processed. Additionally, sparse-coding analysis works better if the dictionary is also learned via sparse coding instead of Winner-Take-All. Indeed, analysis based on larger receptive fields (e.g. 8×8, corresponding to a 64×128 crossbar matrix with 2× over-completeness) and using sparse-coding trained dictionary produces excellent reconstruction results, as shown in FIG. 7E. Detailed simulations further show that high quality image reconstruction can still be obtained even in the presence of realistic device variations (FIG. 7F) if the dictionary is learned online using the memristor crossbar. This effect can be explained from the fact that the learning algorithm is self-adaptive and adjusts to the device variabilities during the training stage. As a result, online learning can effectively handle device variations and is particularly suitable for emerging devices such as memristor-based systems where large device variations are expected.

Figure 8:
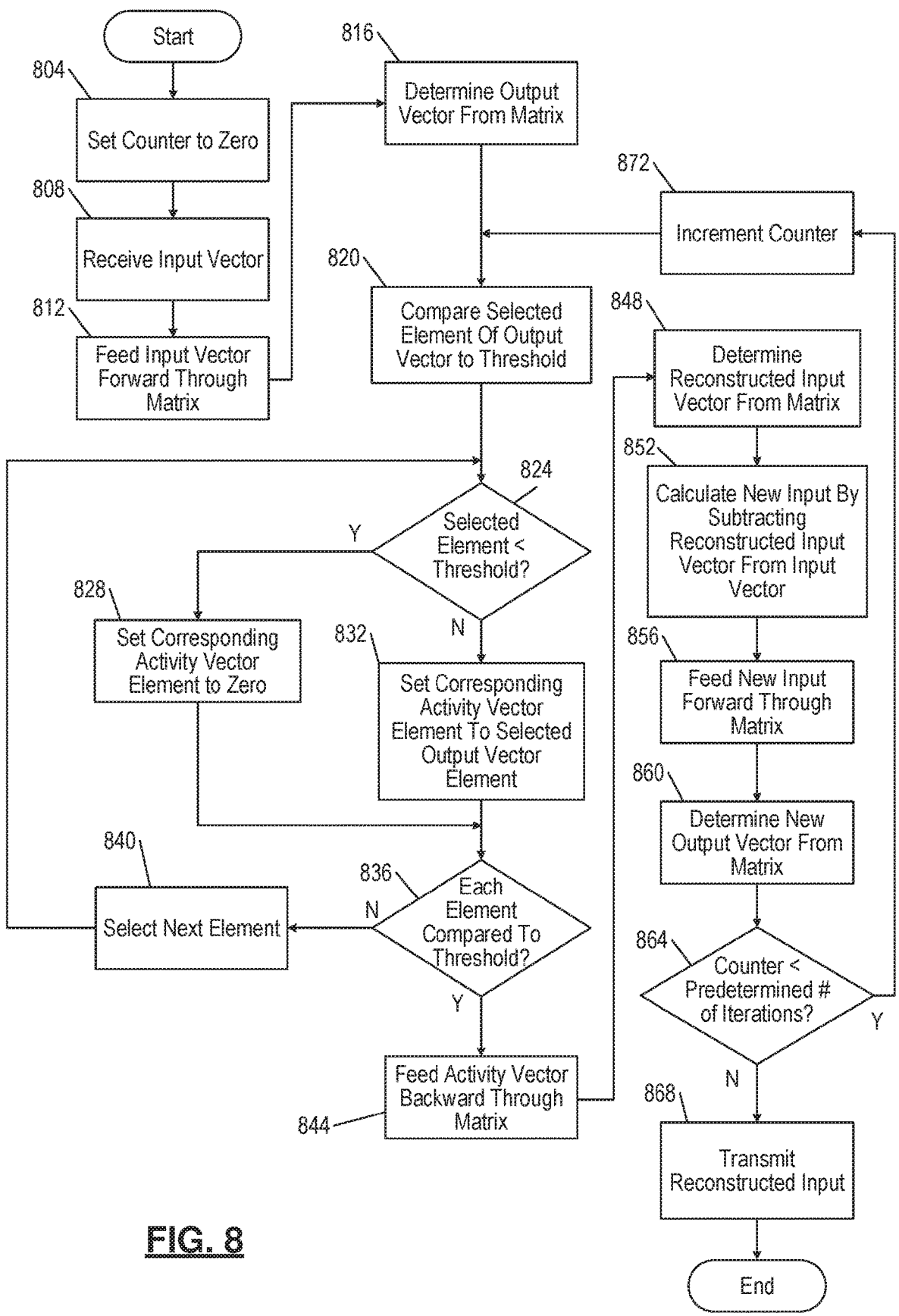
FIG. 8 is a flowchart depicting an example implementation of image reconstruction using a crossbar matrix.

FIG. 8 is a flowchart depicting an example implementation of input reconstruction using the crossbar matrix based hardware. To reconstruct the input, the input is separated into a column vector and each element of the input is represented in numeral form. For example, the input may be an image. Each pixel of the image is represented in a column vector and the intensity of each image is converted into a number indicating the intensity of the pixel. In various implementations, the column vector includes numeric data representing signals and other forms of input for reconstruction.

Control begins at 804, where a counter is set to zero. The counter is used to control a number of iterations of the forward pass and backward pass, as described above. Control continues to 808 where an interface circuit receives an input vector. At 812, the interface circuit feeds the input vector forward through a crossbar matrix, such as the matrix 200 of FIG. 2A. Control continues to 816, where the interface circuit receives an output vector from the matrix. The matrix yields the output vector in response to the forward pass through the matrix. After the interface circuit receives the output vector, control continues to 820 where the interface circuit compares a selected element of the output vector to a threshold value.

Each element of the output vector is compared to the threshold value. As described above, the threshold value is used to set the sparsity of the output and remove redundant representation. Control continues to 824 where, if the selected element is less than the threshold value, the corresponding neuron is considered inactive; therefore, control proceeds to 828. At 828, the interface circuit sets the corresponding element of the neuron activity vector to zero. Otherwise, if the selected element is greater than or equal to the threshold, control continues to 832. At 832, control sets the corresponding element of the activity vector to a value following a given function. Control then proceeds to 836 where control determines if each element of the output vector has been compared to the threshold value. If additional elements of the output vector need to be compared to the threshold value, control proceeds to 840 where the next element of the output vector is selected. After selecting the next element of the output vector at 840, control returns to 824.

If control determines at 836 that each element of the output vector has been compared to the threshold value, control proceeds to 844. At 844 the activity vector is fed backward through the matrix. Control continues to 848 where the reconstructed input vector is determined from the matrix. The reconstructed input vector is the output of the backward feed through the matrix. The reconstructed input is also discussed above and referred to as the intermediate result vector. At 848, the reconstructed input is also received at the interface circuit. Control then continues to 852 where the interface circuit calculates a new input vector. The new input vector is equal to the input vector minus the reconstructed input vector.

At 856, the new input vector is fed forward through the matrix. Control then determines a new output vector from the matrix at 860. Control continues to 864 where control determines if the counter value is less than a predetermined number of iterations. The predetermined number of iterations may be empirically determined. If the predetermined number of iterations have been performed as recorded by the counter, control continues to 868 where the reconstructed input is transmitted to a desired location. For example the reconstructed input may be displayed on a screen. Otherwise, the reconstructed input may be transmitted to a peripheral device for further processing. If at 864 control determines that the counter is less than the predetermined number of iterations, control returns to 872 to increment the counter. After the counter is incremented at 872, control returns to 820 where the new output vector is compared to the threshold value.

Sparse coding hardware system in a memristor crossbar approach, based on pattern matching and neuron lateral inhibition, is an important milestone in the development of large-scale, low power neuromorphic computing systems. The use of a crossbar architecture allows matrix operations, including matrix-vector dot-product operation and matrix transpose operations, to be performed directly and efficiently in the analog domain without the need to read each stored weight and performing multiplication-and-accumulate functions separately in another circuit. Image reconstruction was also demonstrated using the memristor system, and online dictionary learning was shown to be feasible even in the presence of realistic device variations. Future studies, aimed at integrating (ideally larger) crossbar matrices with complementary metal-oxide-semiconductor (CMOS) circuitry that can perform the necessary periphery functions on chip, should provide significant speed improvements and enable online learning implementation. Image preprocessing techniques such as whitening can also be implemented to further improve the network's performance. An integrated memristor system based on devices similar to the prototype system can already offer significant energy advantages when performing data-intensive tasks such as real-time video analysis. Continued optimization of the devices and the architecture can lead to future computing systems that can help eliminate the "von Neumann bottleneck" that is present in conventional computing designs, and produce efficient computing hardware with low energy consumption, small footprint and high throughput.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A memory device comprising:
an array of memory cells arranged in columns and rows;
an interface circuit, coupled to the array of memory cells, and configured to;
receive a set of first vectors and a second vector;
load the set of first vectors in the array of memory cells;
compute a third vector as a dot product of the second vector and the set of first vectors by feeding the second vector forward through the array of memory cells loaded with the first vector;
compute a fourth vector as a non-linear transform of the third vector;
compute a fifth vector as a dot product of the fourth vector and a transpose of the set of first vectors by feeding the fourth vector backward through the array of memory cells loaded with the set of first vectors;
compute a sixth vector as a difference between the fifth vector and the second vector; and
compute a new instance of the third vector as a dot product of the sixth vector and the first vector by feeding the sixth vector through the array of memory cells loaded with the first vector.

2. The memory device of claim 1, wherein the interface circuit configured to load the set of first vectors comprises:
the interface circuit further configured to set one or more memory cell parameters of the array to memory cells to correspond to element values in the set of first vectors.

3. The memory device of claim 1, wherein the interface configured to compute the third vector as a dot product of the second vector and the set of first vectors comprises:
the interface circuit further configured to apply drive signals to corresponding rows of the array of memory cells, wherein the drive signals have one or more fixed signal parameters corresponding to element values of the second vector; and
the interface circuitry further configured to sense signals from corresponding columns of the array of memory cells, wherein the sense signals have one or more signal parameters representing element values of the third vector.

4. The memory device of claim 3, wherein the interface configured to compute the fifth vector as a dot product of the fourth vector and the transpose of the set of first vectors comprises:
the interface circuit further configured to apply drive signals to corresponding columns of the array of memory cells, wherein the drive signals have one or more fixed signal parameters corresponding to element values of the fourth vector; and
the interface circuitry further configured to sense signals from corresponding rows of the array of memory cells, wherein the sense signals have one or more signal parameters representing element values of the fifth vector.

5. The memory device of claim 1, wherein the interface circuit configured to compute a fourth vector as a non-linear transform of the third vector comprises:
the interface circuit further configured to evaluate elements of the third vector in relation to a threshold, including to set a value of elements of the fourth vector to zero when a corresponding value of an element in the third vector is less than the threshold and to set the value of elements of the fourth vector to the corresponding value of the element in the third vector when the corresponding value of the element in the third vector is greater than the threshold.

6. The memory device of claim 1, wherein the third vector represents a sparse coding of the first vector.

7. The memory device of claim 1, wherein the array of memory cells comprise a crossbar array of memristor cells.

8. The memory device of claim 1, wherein the array of memory cells comprise a crossbar array of phase change cells.

9. The memory device of claim 1, wherein:
the array of memory cells are disposed in a first layer of an integrated circuit; and
the interface circuit is disposed in a second layer of the integrated circuit and is coupled to the array of memory cells by interlayer vias (ILV).

10. The memory device of claim 1, wherein the interface circuit is further configured to:
compute a new instance of the fourth vector as the non-linear transform of the new instance of the third vector,
compute a new instance of the fifth vector as the dot product of the new instance of the fourth vector and the transpose of the set of first vectors by feeding the new instance of the fourth vector backward through the array of memory cells loaded with the set of first vectors;
compute a new instance of the sixth vector as a difference between the new instance of the fifth vector and the second vector; and
compute a new instance of the third vector as the dot product of the new instance of the sixth vector and the set of first vectors by feeding the new instance of the third vector through the array of memory cells loaded with the set of first vectors.

11. The memory device of claim 10, wherein the interface circuit is further configured to iteratively compute the new instance of the fourth vector, the new instance of the fifth vector, the new instance of the sixth vector, and the new instance of the third vector a predetermined number of times.

12. A memory device comprising:
an array of memory cells arranged in columns and rows, wherein the array of memory cells include a plurality of tiles of the memory cells;
a number of interface circuits coupled to the plurality of tiles of the array of memory cells, and wherein a first one of the number of interface circuits is configured to;
load a set of one or more first vectors in a first one of the plurality of tiles of the array of memory cells;
feed a second vector forward through the first tile of the array of memory cells to compute a third vector as a dot product of the set of one or more first vectors and the second vector, and
feed a fourth vector backward through the first tile of the array of memory cells to compute a fifth vector as a dot product of the fourth vector and a transpose of the set of one or more first vectors.

13. The memory device of claim 12, wherein the first interface circuit is further configured to:
compute the fourth vector based on the third vector.

14. The memory device of claim 13, wherein the first interface circuit is further configured to:
compute a sixth vector as a difference between the fifth vector and the second vector.

15. The memory device of claim 14, wherein the first interface circuit is further configured to:
feed the sixth vector forward through the first tile of the array of memory cells to compute a new instance of the third vector as a dot product of the sixth vector and the set of one or more first vectors.

16. The memory device of claim 12 wherein a second one of the interface circuits is configured to:
load a set of one or more seventh vectors in a second one of the plurality of tiles of the array of memory cells;
feed an eighth vector forward through the second tile of the array of memory cells to compute a ninth vector as a dot product of the eighth vector and the set of one or more seventh vectors; and
feed a tenth vector backward through the second tile of the array of memory cells to compute an eleventh vector as a dot product of the tenth vector and a transpose of the set of one or more seventh vectors.

17. The memory device of claim 16, wherein the first and second interface circuits are configured to:
feed the second vector forward through the first tile of the array of memory cells to compute the third vector as the dot product of the second vector and the set of one or more first vectors, and feed the eighth vector forward through the second tile of the array of memory cells to compute the ninth vector as the dot product of the eighth vector and the set of one or more seventh vectors substantially in parallel with each other; and
feed the fourth vector backward through the first tile of the array of memory cells to compute the fifth vector as the dot product of the fourth vector and the transpose of the set of one or more first vectors, and feed the tenth vector backward through the second tile of the array of memory cells to compute the eleventh vector as the dot product of the tenth vector and the transpose of the set of one or more seventh vectors substantially in parallel with each other.

18. A method comprising:
loading a set of one or more first vectors in an array of memory cells arranged in a plurality of columns and rows;
feeding a second vector into corresponding rows of the array of memory cells and sensing the corresponding columns loaded with the set of one or more first vectors to compute a third vector as a dot product of the second vector and the set of one or more first vectors; and
feeding a fourth vector into corresponding columns of the array of memory cells and sensing the corresponding rows loaded with the set of one or more first vectors to compute a fifth vector as a dot product of the fourth vector and a transpose of the set of one or more first vectors.

19. The method according to claim 18, further comprising:
computing the fourth vector as a non-linear transform of the third vector.

20. The method according to claim 19, further comprising:
computing a sixth vector as a difference between the fifth vector and the second vector.

21. The method according to claim 20, further comprising:
feeding the sixth vector into corresponding rows of the array of memory cells and sensing the corresponding columns loaded with the first vector to compute a new instance of the third vector as a dot product of the sixth vector and the set of one or more first vectors.

22. The method according to claim 21, further comprising iteratively computing new instances of the third, fourth, fifth and sixth vectors a predetermined number of times.

23. The method according to claim 22, wherein:
the columns of the set of one or more first vectors represent potential features in the second vector,
the second vector includes a plurality of elements representing intensity of pixels in an image;
the third vector represents features present in the second vector;
the fourth vector includes a plurality of elements representing levels of neuron activity;
the fifth vector represents a reconstruction of the second vector; and
the sixth vector represents a residual between the second vector and the reconstruction of the second vector.

24. The method according to claim 23, wherein the third vector after the predetermined number of iterations represents a sparse coding of the second vector.

* * * * *